(12) United States Patent
Tsuda

(10) Patent No.: US 8,957,565 B2
(45) Date of Patent: Feb. 17, 2015

(54) ACOUSTIC WAVE DEVICE AND METHOD FOR MANUFACTURING THE SAME

(71) Applicant: Murata Manufacturing Co., Ltd., Nagaokakyo-shi, Kyoto-fu (JP)

(72) Inventor: Motoji Tsuda, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/871,069

(22) Filed: Apr. 26, 2013

(65) Prior Publication Data
US 2013/0234558 A1 Sep. 12, 2013

Related U.S. Application Data

(63) Continuation of application No. PCT/JP2011/065654, filed on Jul. 8, 2011.

(30) Foreign Application Priority Data

Nov. 10, 2010 (JP) ................. 2010-251373

(51) Int. Cl.
*H03H 9/02* (2006.01)
*H01L 41/047* (2006.01)
(Continued)

(52) U.S. Cl.
CPC ........... *H01L 41/0477* (2013.01); *H03H 9/059* (2013.01); *H01L 41/293* (2013.01); *H03H 9/02992* (2013.01)
USPC ..................................... 310/313 B; 310/364

(58) Field of Classification Search
CPC .......... H03H 9/02992; H03H 9/02535; H03H 9/0514; H03H 9/059
USPC ...... 310/313 R, 313 A, 313 B, 313 C, 313 D, 310/363, 364
See application file for complete search history.

(56) References Cited

U.S. PATENT DOCUMENTS

2002/0145362 A1 * 10/2002 Taga .......................... 310/313 R
2003/0025422 A1 2/2003 Watanabe et al.
(Continued)

FOREIGN PATENT DOCUMENTS

CN          1396709 A     2/2003
CN        101765971 A     6/2010
(Continued)

OTHER PUBLICATIONS

Official Communication issued in International Patent Application No. PCT/JP2011/065654, mailed on Sep. 20, 2011.
(Continued)

*Primary Examiner* — Derek Rosenau
(74) *Attorney, Agent, or Firm* — Keating & Bennett, LLP

(57) ABSTRACT

An acoustic wave device includes a first electrode film arranged on a top surface of a piezoelectric substrate and defining electrodes including IDT electrodes and a second electrode film arranged to extend from the top surface of the piezoelectric substrate to a portion of a top surface of the first electrode film. The second electrode film defines electrodes including a wiring electrode 9 and pad electrodes and is made of a layered metal film including a plurality of metal films deposited in layers. The lowermost layer of the second electrode film is made of a metal selected from the group consisting of aluminum-copper alloy, nickel-chromium alloy, aluminum-silicon alloy, aluminum-titanium alloy, titanium, and copper, and the lowermost layer of the second electrode film is arranged to extend to a side surface of the second electrode film.

9 Claims, 16 Drawing Sheets

(51) Int. Cl.
*H03H 9/05* (2006.01)
*H01L 41/293* (2013.01)

(56) References Cited

U.S. PATENT DOCUMENTS

2005/0071971 A1  4/2005 Yamato
2007/0284966 A1* 12/2007 Kadota et al. ............. 310/313 R
2010/0117483 A1  5/2010 Tanaka et al.

FOREIGN PATENT DOCUMENTS

| EP | 1 089 431 A2 | 4/2001 |
|---|---|---|
| JP | 09-098043 A | 4/1997 |
| JP | 2001-168676 A | 6/2001 |
| JP | 2002-026686 A | 1/2002 |
| JP | 2003-283282 A | 10/2003 |
| JP | 2005-117151 A | 4/2005 |
| JP | 2005-318017 A | 11/2005 |
| JP | 2006-238327 A | 9/2006 |
| JP | 2008-121103 A | 5/2008 |
| JP | 2010-081086 A | 4/2010 |
| JP | 2010-106325 A | 5/2010 |
| JP | 2010-252321 A | 11/2010 |

OTHER PUBLICATIONS

Official Communication issued in corresponding Chinese Patent Application No. 201180053402.2, mailed on Oct. 10, 2014.

* cited by examiner

ACOUSTIC WAVE DEVICE AND METHOD FOR MANUFACTURING THE SAME

BACKGROUND OF THE INVENTION

1. Field of the Invention

The present invention relates to acoustic wave devices, including surface acoustic wave filters and boundary acoustic wave filters, and methods for manufacturing such acoustic wave devices. More specifically the present invention relates to an acoustic wave device including a piezoelectric substrate on which electrodes including IDT electrodes, wiring electrodes, and pad electrodes are arranged and a method for manufacturing such an acoustic wave device.

2. Description of the Related Art

Acoustic wave devices are widely used as bandpass filters and duplexers for mounting on radio-frequency (RF) circuits in communication equipment such as cellular phones. Known acoustic wave devices include surface acoustic wave devices, which use surface acoustic waves, and boundary acoustic wave devices, which use boundary acoustic waves.

An acoustic wave device includes a piezoelectric substrate and electrodes arranged on the piezoelectric substrate, including Inter-Digital Transducer (IDT) electrodes, wiring electrodes, and pad electrodes.

The Background Art section of Japanese Unexamined Patent Application Publication No. 2005-117151 discloses a surface acoustic wave device including wiring electrodes continuous with IDT electrodes and made of a layered metal film including a plurality of electrode films deposited in layers. According to the disclosure in Japanese Unexamined Patent Application Publication No. 2005-117151, this structure reduces the resistance of the wiring electrodes.

For a surface acoustic wave device of the invention disclosed in Japanese Unexamined Patent Application Publication No. 2005-117151, a first electrode film is initially arranged on a piezoelectric substrate to define electrode portions including IDT electrodes. A second electrode film is then arranged to overlap the first electrode film. The second electrode film is arranged in the regions where bus bars of the IDT electrodes, wiring electrodes, and pad electrodes are to be arranged. The second electrode film can be made thicker to reduce the wiring resistance. According to the disclosure in Japanese Unexamined Patent Application Publication No. 2005-117151, the second electrode film can be defined using an appropriate conductive material such as aluminum, copper, gold, or titanium.

An acoustic wave device such as the surface acoustic wave device disclosed in Japanese Unexamined Patent Application Publication No. 2005-117151 might suffer migration in an electrode film defining wiring electrodes. Migration might cause a break in the wiring electrodes and a short circuit between wiring electrodes connected to different potentials due to whiskers and electrode scraps produced by migration.

Migration occurs when acoustic wave vibrations induced by IDT electrodes are applied to the wiring electrodes. In addition, migration probably occurs when heat due to passage of high-frequency power through the wiring electrodes is applied to the wiring electrodes. In particular, migration is more likely to occur in wiring electrodes made of aluminum or gold.

SUMMARY OF THE INVENTION

Preferred embodiments of the present invention provide an acoustic wave device in which migration can be effectively inhibited in an electrode film defining a wiring electrode, so that the wiring electrode is unlikely to be broken or short-circuited, and also to provide a method by which such an acoustic wave device can be manufactured.

An acoustic wave device according to a preferred embodiment of the present invention includes a piezoelectric substrate, a first electrode film arranged on a top surface of the piezoelectric substrate and defining electrodes including IDT electrodes, and a second electrode film arranged to extend from the top surface of the piezoelectric substrate to a portion of a top surface of the first electrode film. In the acoustic wave device according to the present preferred embodiment of the present invention, the second electrode film preferably defines electrodes including a wiring electrode and a pad electrode and is made of a layered metal film including a plurality of metal films deposited in layers. The lowermost layer of the layered metal film defining the second electrode film preferably is made of a metal selected from the group consisting of aluminum-copper alloy, nickel-chromium alloy, aluminum-silicon alloy, aluminum-titanium alloy, titanium, and copper, and the lowermost layer of the layered metal film defining the second electrode film is arranged to extend to a side surface of the second electrode film.

In a particular preferred embodiment of the acoustic wave device according to the present invention, the layered metal film defining the second electrode film preferably includes a metal film made of aluminum or gold.

In another particular preferred embodiment of the acoustic wave device according to the present invention, the uppermost layer of the layered metal film defining the second electrode film preferably is made of a metal selected from the group consisting of aluminum-copper alloy, nickel-chromium alloy, aluminum-silicon alloy, aluminum-titanium alloy, titanium, and copper.

In yet another particular preferred embodiment of the acoustic wave device according to the present invention, the acoustic wave device preferably further includes a third electrode film arranged on the second electrode film.

In still another particular preferred embodiment of the acoustic wave device according to the present invention, the third electrode film preferably is made of a metal selected from the group consisting of aluminum-copper alloy, nickel-chromium alloy, aluminum-silicon alloy, aluminum-titanium alloy, titanium, and copper.

In still yet another particular preferred embodiment of the acoustic wave device according to the present invention, the acoustic wave device preferably further includes an insulating film arranged on the second electrode film.

The insulating film may preferably include a film made of an inorganic insulating material selected from the group consisting of $SiO_2$, AlN, $Al_2O_3$, $Ta_2O_5$, $TeO_2$, SiN, and SiON.

The insulating film may preferably include a film made of an organic insulating material selected from the group consisting of polyimides, epoxy resins, phenolic resins, and amide resins.

The insulating film may preferably include a film made of an inorganic insulating material selected from the group consisting of $SiO_2$, AlN, $Al_2O_3$, $Ta_2O_5$, $TeO_2$, SiN, and SiON and a film made of an organic insulating material selected from the group consisting of polyimides, epoxy resins, phenolic resins, and amide resins.

A method for manufacturing an acoustic wave device according to another preferred embodiment of the present invention includes the steps of forming a first electrode film that defines electrodes including IDT electrodes on a top surface of a piezoelectric substrate; forming a resist layer so as to cover the top surfaces of the first electrode film and the piezoelectric substrate; patterning the resist layer to form a resist pattern including an opening; depositing a plurality of metal films in sequence after forming the resist pattern including the opening such that, of the plurality of metal films, the metal film deposited first extends from the top surface of the piezoelectric substrate to a side surface of the resist pattern; and removing the resist pattern to form a second electrode film that is made of a layered metal film including the plurality of metal films and that defines electrodes including a wiring electrode and a pad electrode.

In a particular preferred embodiment of the method for manufacturing an acoustic wave device according to the present invention, the plurality of metal films preferably are continuously deposited by evaporation.

In another particular preferred embodiment of the method for manufacturing an acoustic wave device according to the present invention, the plurality of metal films preferably are continuously deposited by evaporation using a planetary rotating and orbiting vacuum evaporation system.

In yet another particular preferred embodiment of the method for manufacturing an acoustic wave device according to the present invention, of the plurality of metal films, the metal film deposited first preferably is made of a metal selected from the group consisting of aluminum-copper alloy, nickel-chromium alloy, aluminum-silicon alloy, aluminum-titanium alloy, titanium, and copper.

In still another particular preferred embodiment of the method for manufacturing an acoustic wave device according to the present invention, the plurality of metal films preferably include a metal film made of aluminum or gold.

In still yet another particular preferred embodiment of the method for manufacturing an acoustic wave device according to the present invention, of the plurality of metal films, the metal film deposited last preferably is made of a metal selected from the group consisting of aluminum-copper alloy, nickel-chromium alloy, aluminum-silicon alloy, aluminum-titanium alloy, titanium, and copper.

In still yet another particular preferred embodiment of the method for manufacturing an acoustic wave device according to the present invention, the method further includes a step of forming a third electrode film on the second electrode film.

The third electrode film is preferably made of a metal film selected from the group consisting of aluminum-copper alloy, nickel-chromium alloy, aluminum-silicon alloy, aluminum-titanium alloy, titanium, and copper.

In still yet another particular preferred embodiment of the method for manufacturing an acoustic wave device according to the present invention, the method preferably further includes a step of defining an insulating film on the second electrode film.

The insulating film may preferably include a film made of an inorganic insulating material selected from the group consisting of $SiO_2$, AlN, $Al_2O_3$, $Ta_2O_5$, $TeO_2$, SiN, and SiON, may include a film made of an organic insulating material selected from the group consisting of polyimides, epoxy resins, phenolic resins, and amide resins, or may include a film made of an inorganic insulating material selected from the group consisting of $SiO_2$, AlN, $Al_2O_3$, $Ta_2O_5$, $TeO_2$, SiN, and SiON and a film made of an organic insulating material selected from the group consisting of polyimides, epoxy resins, phenolic resins, and amide resins.

In the acoustic wave device according to various preferred embodiments of the present invention, because the second electrode film defines electrodes including a wiring electrode and a pad electrode and is made of a layered metal film including a plurality of metal films deposited in layers, the lowermost layer of the layered metal film defining the second electrode film preferably is made of a metal selected from the group consisting of aluminum-copper alloy, nickel-chromium alloy, aluminum-silicon alloy, aluminum-titanium alloy, titanium, and copper, and the lowermost layer of the layered metal film defining the second electrode film is arranged to extend to a side surface of the second electrode film, migration can be effectively inhibited in the wiring electrode. Accordingly, a break in the wiring electrode and a short-circuit due to, for example, whiskers can be prevented.

In the method for manufacturing an acoustic wave device according to a preferred embodiment of the present invention, the acoustic wave device according to a preferred embodiment of the present invention can be manufactured by forming a first electrode film that defines electrodes including IDT electrodes on a top surface of a piezoelectric substrate; forming a resist pattern including an opening; depositing a plurality of metal films in sequence such that, of the plurality of metal films, the metal film deposited first extends from the top surface of the piezoelectric substrate to a side surface of the resist pattern; and removing the resist pattern to form a second electrode film that defines electrodes including a wiring electrode and a pad electrode. Accordingly, an acoustic wave device of a preferred embodiment of the present invention which is resistant to migration in a wiring electrode, and which is therefore resistant to short-circuits in the wiring electrode, can be provided. With the above process, additionally, the acoustic wave device of various preferred embodiments of the present invention can be easily provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Specific preferred embodiments of the present invention will now be described to illustrate the present invention.

First Preferred Embodiment

A method for manufacturing an acoustic wave device according to a first preferred embodiment of the present invention will be described with reference to FIGS. 1A to 7B to illustrate the structure of the acoustic wave device.

Figure 1A:
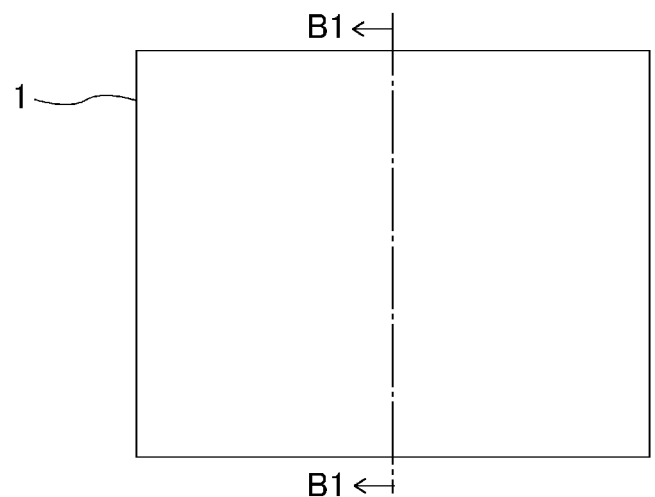
FIG. 1A is a schematic plan view showing the state after a piezoelectric substrate is prepared in a method for manufacturing an acoustic wave device according to a first preferred embodiment of the present invention.
Figure 1B:
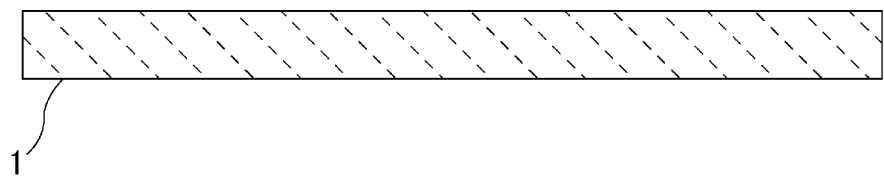
FIG. 1B is a schematic sectional view taken along line B1-B1 in FIG. 1A.

Referring first to FIGS. 1A and 1B, a piezoelectric substrate 1 is prepared. The piezoelectric substrate 1 preferably is a lithium tantalate substrate in this preferred embodiment. The piezoelectric substrate 1, however, may be any other desirable piezoelectric substrate, such as, for example, a lithium niobate substrate, a lithium tetraborate substrate, a langasite substrate, a quartz crystal substrate, etc.

Figure 2A:
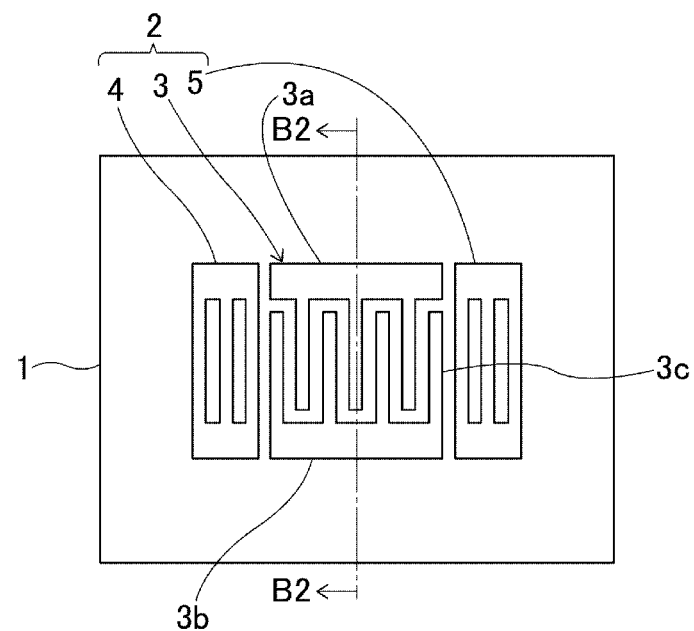
FIG. 2A is a schematic plan view showing the state after a first electrode film is arranged on the piezoelectric substrate in the method for manufacturing the acoustic wave device according to the first preferred embodiment of the present invention.
Figure 2B:
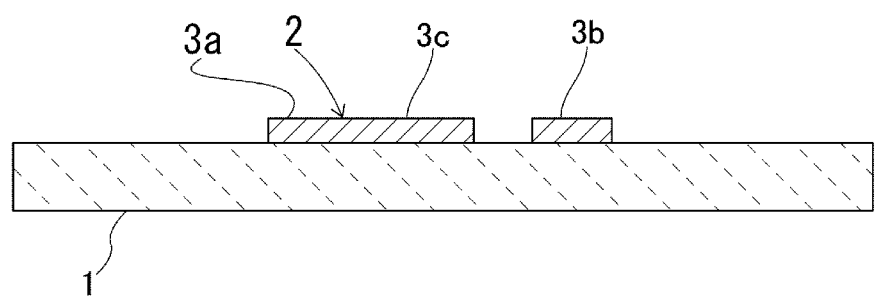
FIG. 2B is a schematic sectional view taken along line B2-B2 in FIG. 2A.

Turning to FIGS. 2A and 2B, a first electrode film 2 is arranged on the top surface of the piezoelectric substrate 1. The first electrode film 2 defines Inter-Digital Transducer (IDT) electrodes 3 and reflectors 4 and 5. The IDT electrodes 3 preferably include a pair of bus bars 3a and 3b and a plurality of electrode fingers 3c connected to the bus bar 3a or the bus bar 3b. The reflectors 4 and 5 include a pair of bus bars and a plurality of electrode fingers connected to both of the pair of bus bars.

In this preferred embodiment, the first electrode film 2 is preferably made of a layered metal film including, for example, a titanium film and an aluminum-copper alloy film deposited thereon. The titanium film preferably has a thickness of about 10 nm, and the aluminum-copper alloy film preferably has a thickness of about 150 nm, for example. In addition, the aluminum-copper alloy film preferably has a copper concentration of about 1% by weight, for example.

In the present invention, however, the first electrode film 2 is not limited to the above layered metal film. Examples of materials that can be used for the metal films defining the first electrode film 2 include metals such as, for example, aluminum, platinum, gold, tungsten, palladium, silver, nickel, chromium, copper, magnesium, and tantalum and alloys mainly containing these metals. In this preferred embodiment, the first electrode film 2 is preferably formed by a lift-off process with evaporation. The first electrode film 2, however, may be formed by other methods such as, for example, sputtering and etching.

The first electrode film 2 may also be made of a single metal film.

Figure 3A:
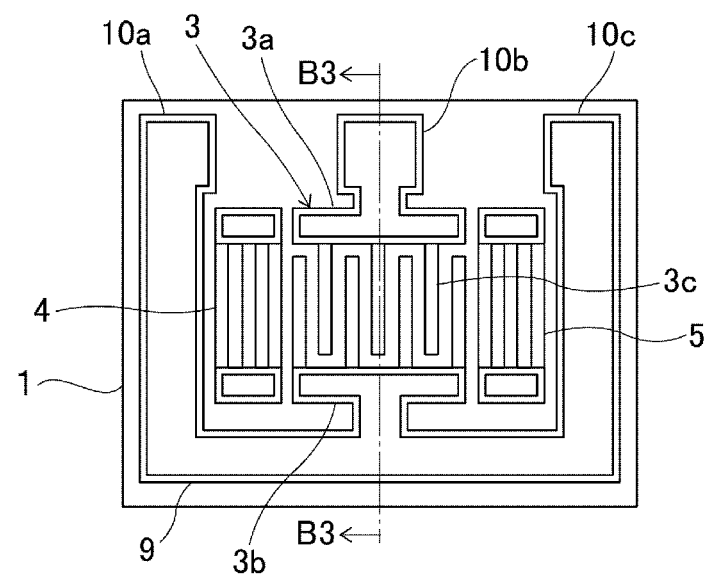
FIG. 3A is a schematic plan view showing the state after a second electrode film is arranged in the method for manufacturing the acoustic wave device according to the first preferred embodiment of the present invention.
Figure 3B:
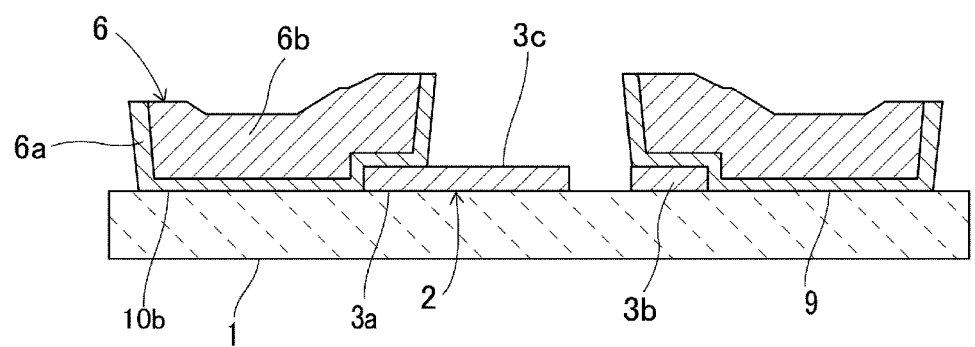
FIG. 3B is a schematic sectional view taken along line B3-B3 in FIG. 3A.

Turning to FIGS. 3A and 3B, a second electrode film 6 is provided. The second electrode film 6 is arranged to extend from the top surface of the piezoelectric substrate 1 to a portion of the top surface of the first electrode film 2. More specifically, the second electrode film 6 is arranged to extend from the top surface of the piezoelectric substrate 1 to the tops of the bus bars 3a and 3b of the IDT electrodes 3 and the bus bars of the reflectors 4 and 5.

The second electrode film 6 defines the bus bars 3a and 3b of the IDT electrodes 3, the bus bars of the reflectors 4 and 5, a wiring electrode 9, and pad electrodes 10a to 10c. Accordingly, the bus bars 3a and 3b of the IDT electrodes 3 are preferably made of the laminate of the first electrode film 2 and the second electrode film 6. The same applies to the bus bars of the reflectors 4 and 5. This improves the effect of confining surface acoustic waves in the IDT electrodes 3.

The electrode fingers 3c of the IDT electrodes 3 and the electrode fingers of the reflectors 4 and 5 are preferably composed only of the first electrode film 2. The wiring electrode 9 and the pad electrodes 10a to 10c are preferably composed only of the second electrode film 6.

In the present preferred embodiment, the second electrode film 6 is preferably made of a layered metal film including an aluminum-copper alloy film, a titanium film, and an aluminum film deposited in this order. That is, as shown in FIG. 3B, the lowermost layer 6a of the second electrode film 6 is preferably made of an aluminum-copper alloy film.

In FIG. 3B and the subsequent figures, the metal films other than the lowermost layer 6a in the second electrode film 6 are collectively shown as an upper layer 6b. In addition, the uppermost layer of the second electrode film 6 is assigned a reference sign if the uppermost layer should be distinguished from the remaining metal layers, as described later.

Preferably, the aluminum-copper alloy film has a thickness of about 700 nm, the titanium film has a thickness of about 500 nm, and the aluminum film has a thickness of about 1,140 nm, for example. In addition, the aluminum-copper alloy film preferably has a copper concentration of about 10% by weight, for example.

In the present invention, however, the second electrode film 6 is not limited to the above layered metal film. That is, as long as the second electrode film 6 is made of a layered metal film including a plurality of metal films deposited in layers, the lowermost layer 6a may be a metal film made of a metal selected from the group consisting of aluminum-copper alloy, nickel-chromium alloy, aluminum-silicon alloy, aluminum-titanium alloy, titanium, and copper, for example. Non-limiting examples of materials that can be used for the metal films defining the upper layer 6b include metals such as, for example, aluminum, platinum, gold, tungsten, palladium, silver, nickel, chromium, copper, magnesium, and tantalum and alloys mainly containing these metals.

The layers other than the lowermost layer 6a are preferably made of a metal film of aluminum to reduce the resistance of the second electrode film 6, particularly, to reduce the resistance of the wiring electrode 9.

In addition, if gold bumps, for example, are arranged on the pad electrodes 10a to 10c, which are preferably composed only of the second electrode film 6, the uppermost layer of the second electrode film 6 is preferably made of a metal film of gold. This increases the adhesion strength of the bumps. In this preferred embodiment, as described above, the second electrode film 6 includes an aluminum film, which reduces the resistance of the wiring electrode 9. In addition, the second electrode film 6 is thicker than the first electrode film 2. This also reduces the resistance of the wiring electrode 9.

An example of a preferred embodiment of a method for defining the second electrode film 6 on the piezoelectric substrate 1 will now be described with reference to FIGS. 4A to 6B, although the method is not limited thereto, as described above.

Figure 4A:
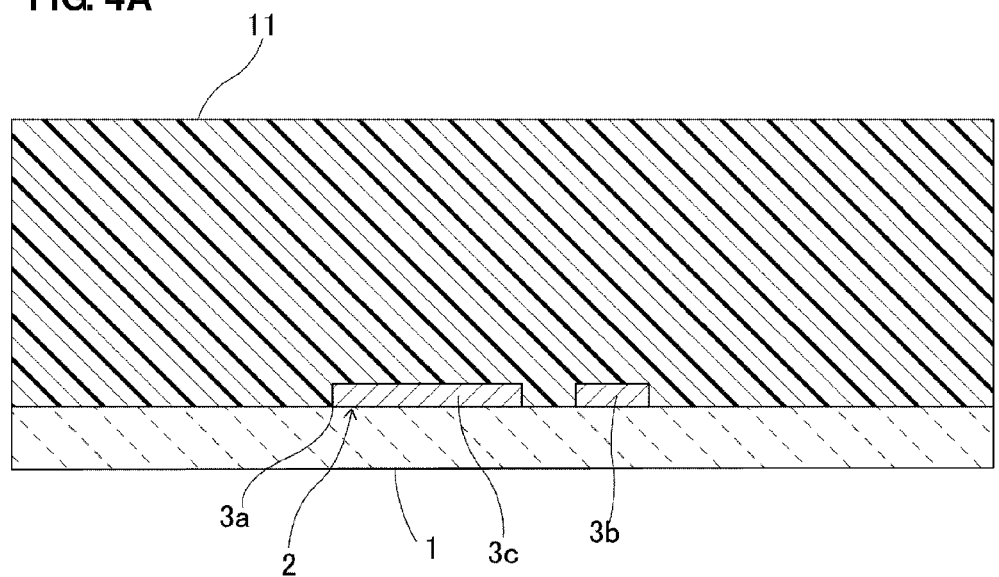
FIG. 4A is a schematic sectional view showing the state after a resist layer is arranged on the piezoelectric substrate on which the first electrode film is arranged in the method for manufacturing the acoustic wave device according to the first preferred embodiment of the present invention.
Figure 4B:
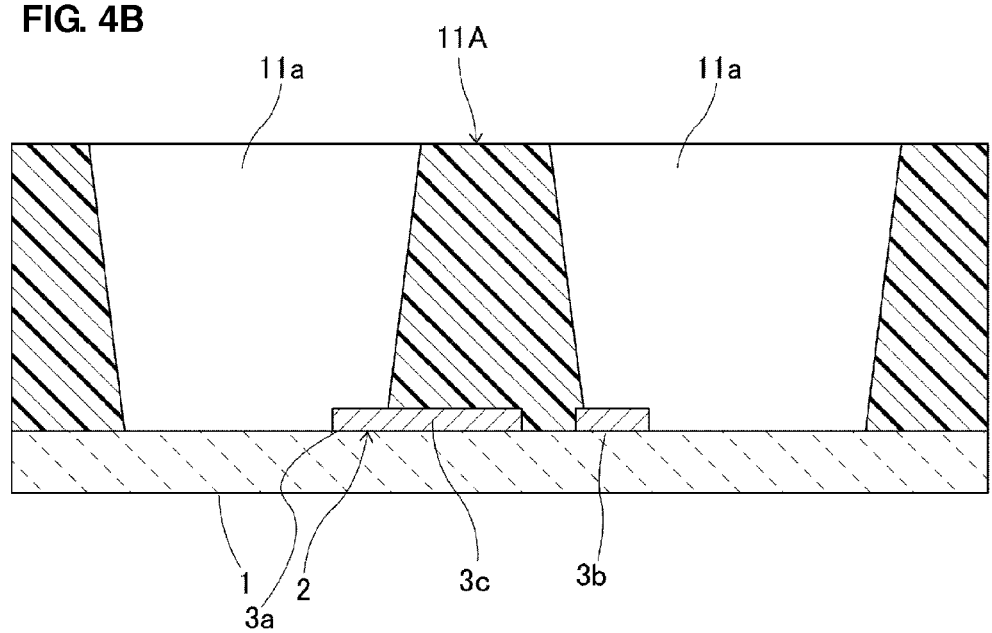
FIG. 4B is a schematic sectional view showing the state after a resist pattern is formed.

Referring first to FIG. 4A, a resist layer 11 is arranged to cover the entire top surface of the piezoelectric substrate 1 on which the first electrode film 2 is provided. That is, the resist layer 11 is arranged to cover the entire top surfaces of the first electrode film 2 and the piezoelectric substrate 1. The resist layer 11 is preferably made of a photoresist. Turning to FIG. 4B, the resist layer 11 is preferably patterned by exposure to form a resist pattern 11A including openings 11a. The openings 11a are located in the region where the second electrode film 6 is to be arranged on the first electrode film 2 so as to overlap the first electrode film 2 and the region where the second electrode film 6 is to be arranged on the piezoelectric substrate 1. After the resist pattern 11A is formed, a layered metal film that defines the second electrode film 6 is preferably deposited by evaporation. In this preferred embodiment, an aluminum-copper alloy film, a titanium film, and an aluminum film are preferably continuously deposited using, for example, a planetary rotating and orbiting vacuum evaporation system.

Figure 6A:
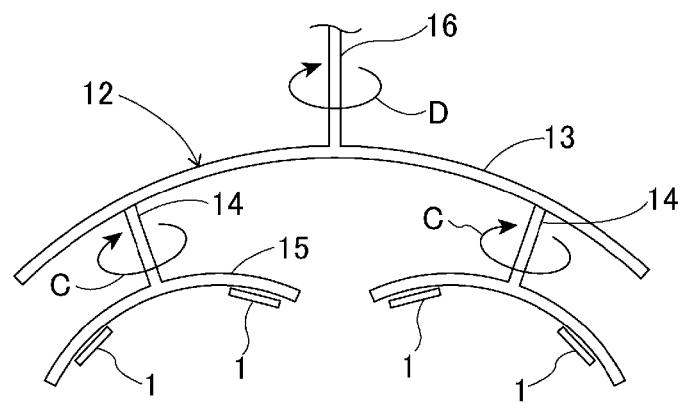
FIGS. 6A and 6B are a schematic sectional view and a schematic plan view, respectively, illustrating a planetary rotating and orbiting vacuum evaporation system used in the method for manufacturing the acoustic wave device according to the first preferred embodiment of the present invention.
Figure 6A:
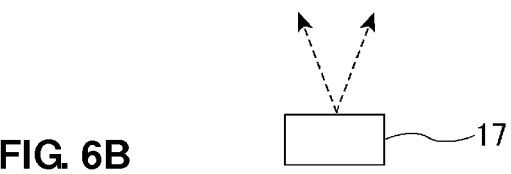
Figure 6B:
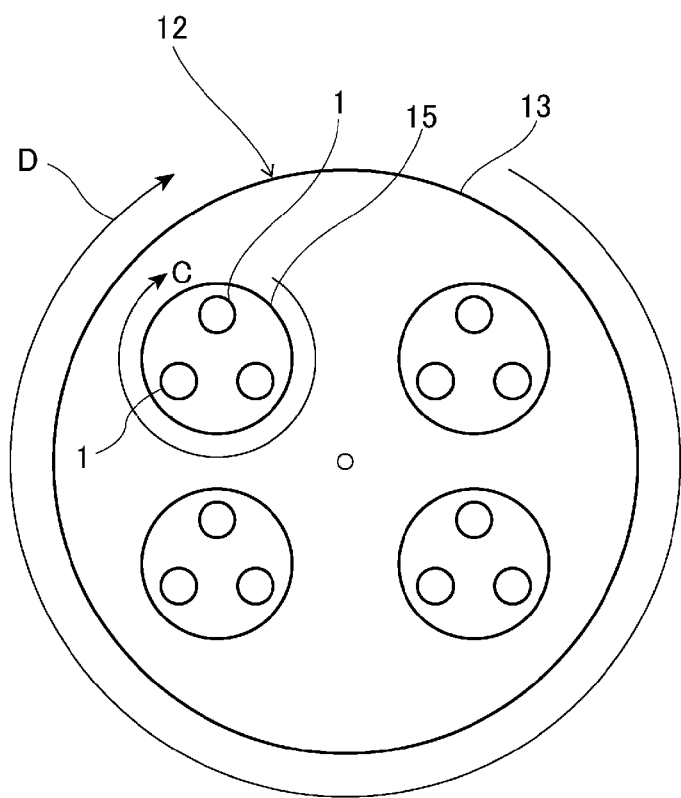

Turning to FIGS. 6A and 6B, a planetary rotating and orbiting vacuum evaporation system 12 preferably includes a dome 13. Substrate holders 15 are coupled to the bottom surface of the dome 13 with rotating shafts 14 therebetween. The substrate holders 15 are rotated by the rotating shafts 14 in the direction indicated by arrow C shown. A plurality of piezoelectric substrates 1 are held on the bottom surfaces of the substrate holders 15. Although omitted here, the resist pattern 11A has been arranged on the piezoelectric substrates 1.

The top surface of the dome 13 is in turn coupled to a rotating shaft 16 and is rotated by the rotating shaft 16 in the direction indicated by arrow D shown. The rotating shaft 16 is coupled to the center of the dome 13. As described above, the substrate holders 15, coupled to the dome 13 with the rotating shafts 14 therebetween, are rotated in the arrow C direction. That is, the piezoelectric substrates 1 held by the substrate holders 15 are rotated in the arrow C direction by the rotating shafts 14, and the substrate holders 15 themselves are rotated in the arrow D direction by the rotating shaft 16.

Evaporation is performed in a vacuum with an evaporation source 17 disposed below the dome 13. By replacing the evaporation source 17, the aluminum-copper alloy film, the titanium film, and the aluminum film that form the second electrode film 6 can preferably be continuously deposited in sequence.

Figure 5A:
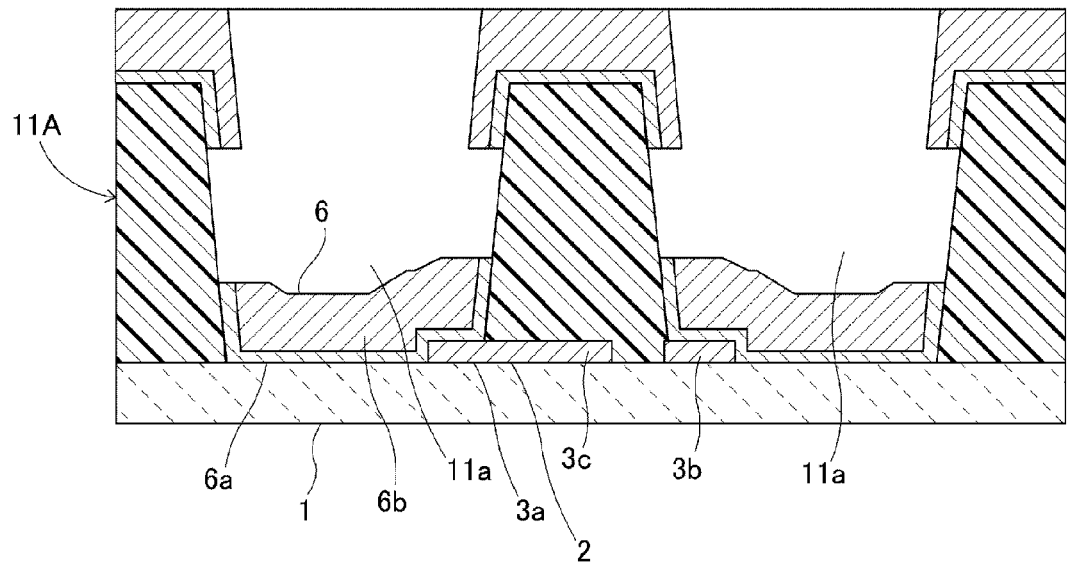
FIG. 5A is a schematic sectional view showing the state after a layered metal film defining a second electrode layer is arranged in the method for manufacturing the acoustic wave device according to the first preferred embodiment of the present invention.

The planetary rotating and orbiting vacuum evaporation system is a known structure, as disclosed in, for example, Japanese Unexamined Patent Application Publication Nos. 2010-106325 and 2008-121103. By depositing the second electrode film by evaporation using the planetary rotating and orbiting vacuum evaporation system 12, as shown in FIG. 5A, the second electrode film 6 can be reliably formed such that the portion of the second electrode film 6 defining the lowermost layer 6a extends to the side surfaces of the resist pattern 11A.

Figure 5B:
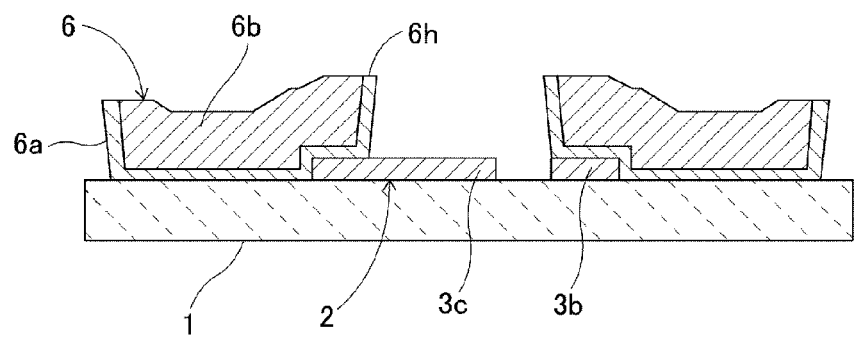
FIG. 5B is a schematic sectional view showing the state after the resist pattern is removed.

The resist pattern 11A and the layered metal film arranged on the resist pattern 11A are then preferably removed by a lift-off process. Thus, as shown in FIG. 5B, the second electrode film 6 can be arranged to extend from the top surface of the piezoelectric substrate 1 to a portion of the top surface of the first electrode film 2. The lowermost layer 6a of the second electrode film 6 is arranged to extend to the side surfaces of the second electrode film 6.

Figure 8:
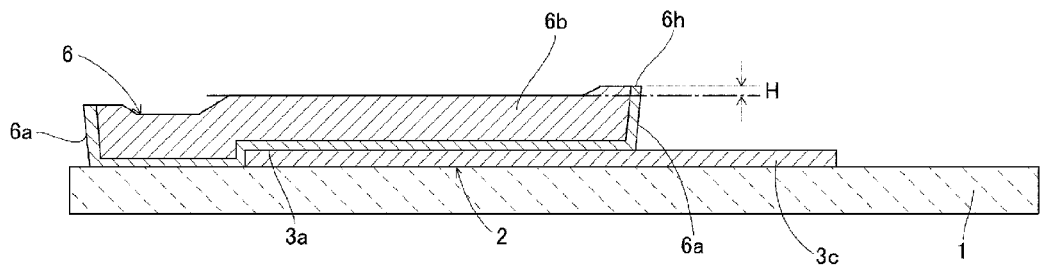
FIG. 8 is a schematic sectional view illustrating the profile of the lowermost layer of the second electrode layer in the acoustic wave device according to the first preferred embodiment of the present invention.

In the above evaporation process, as indicated by a height difference H in FIG. 8, the top end 6h of the portion of the lowermost layer 6a extending along the side surfaces of the second electrode film 6 is located higher than the top of the main portion of the rest of the second electrode film 6, namely, the upper layer 6b. Thus, the top end 6h of the portion of the lowermost layer 6a extending along the side surfaces of the second electrode film 6 may preferably be higher than the top surface of the uppermost one of the other metal films defining the second electrode film 6. This effectively inhibits migration.

Figure 7A:
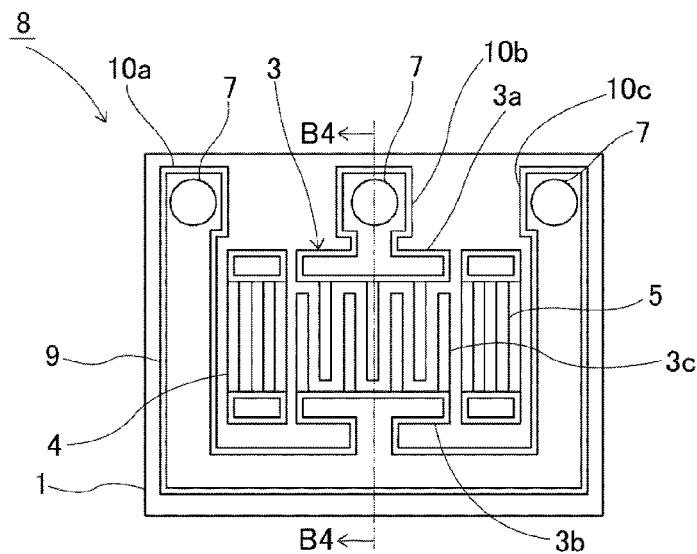
FIG. 7A is a schematic plan view of an acoustic wave device manufactured by the method for manufacturing the acoustic wave device according to the first preferred embodiment of the present invention.
Figure 7B:
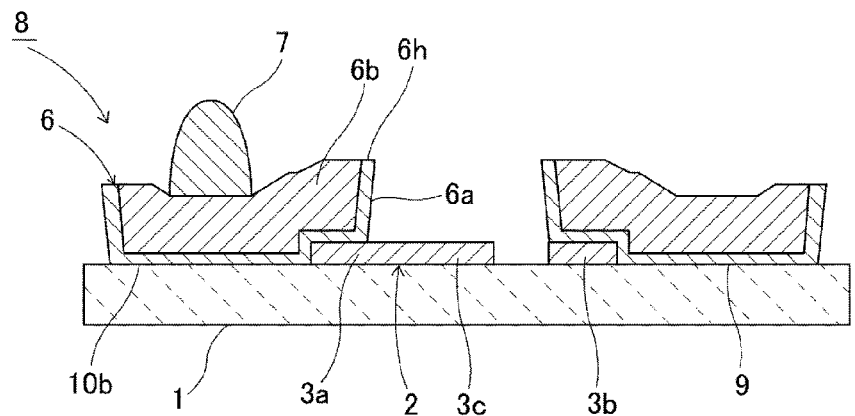
FIG. 7B is a schematic sectional view taken along line B4-B4 in FIG. 7A.

Turning to FIGS. 7A and 7B, gold bumps 7 are preferably arranged on the pad electrodes 10a to 10c. The bumps may alternatively be made of another metal such as, for example, aluminum or solder.

In this way, an acoustic wave device 8 shown in FIGS. 7A and 7B can be manufactured. The acoustic wave device 8 is preferably a one-port surface acoustic wave resonator.

In the acoustic wave device 8 of this preferred embodiment, migration can be reliably inhibited in the wiring electrode 9. This will be more specifically described below.

A common acoustic wave device including a wiring electrode made of a layered metal film including an aluminum film or a gold film tends to suffer migration in the electrode films defining the wiring electrode. Migration occurs when acoustic wave vibrations induced by IDT electrodes are applied to the wiring electrode or when heat due to passage of high-frequency power through the wiring electrode is applied to the wiring electrode. For an aluminum film or a gold film, migration tends to occur at a temperature of about 150° C. to about 200° C.

In a surface acoustic device using Rayleigh waves, particularly, surface acoustic waves leak from IDT electrodes or reflectors in various directions. Surface acoustic wave devices therefore have a problem in that migration tends to occur in a wiring electrode disposed around the IDT electrodes or the reflectors.

In a surface acoustic wave device using leaky waves, on the other hand, surface acoustic waves leak from IDT electrodes or reflectors in the propagation direction of the surface acoustic waves. Accordingly, migration tends to occur in a wiring electrode disposed on a line extending from the IDT electrodes and the reflectors in the propagation direction of the surface acoustic waves.

In the acoustic wave device 8 of this preferred embodiment, in contrast, the lowermost layer 6a of the second electrode film 6, which defines the wiring electrode 9, is preferably made of an aluminum-copper alloy film. This aluminum-copper alloy film, defining the lowermost layer 6a, is arranged to cover the side surfaces of the upper layer 6b, which is preferably made of a titanium film and an aluminum film. An aluminum-copper alloy film is resistant to migration; it does not occur even at a temperature of about 150° C. to about 200° C.

In addition, migration in an aluminum film in the electrode films defining a wiring electrode tends to occur in the side surfaces thereof. In this preferred embodiment, the side surfaces of the aluminum film in the upper layer 6b are covered with the lowermost layer 6a, which is preferably made of an aluminum-copper alloy film. The acoustic wave device 8 is therefore resistant to migration in the side surfaces of the aluminum film in the upper layer 6b even when exposed to a temperature of about 150° C. to about 200° C. Because the side surfaces of the aluminum film in the upper layer 6b are covered with the portion of the lowermost layer 6a extending along the side surfaces of the second electrode film 6, as shown in FIG. 7B, migration can be effectively inhibited in the second electrode film 6, which defines the wiring electrode 9.

While the lowermost layer 6a, which inhibits migration, is preferably made of an aluminum-copper alloy film in this preferred embodiment, the lowermost layer 6a may alternatively be made of another metal that is more resistant to migration than the metal films of the other layers of the second electrode film 6. Examples of these metals include aluminum-copper alloy, nickel-chromium alloy, aluminum-silicon alloy, aluminum-titanium alloy, titanium, and copper. Metal films made of aluminum-copper alloy, nickel-chromium alloy, aluminum-silicon alloy, aluminum-titanium alloy, titanium, and copper are more resistant to migration than an aluminum film and a gold film. These metals can therefore be used to reliably inhibit migration in the second electrode film 6.

The lowermost layer 6a preferably has a thickness of about 100 nm or more, for example. If the lowermost layer 6a has a thickness of about 100 nm or more, it can more effectively inhibit migration in the aluminum film in the upper layer 6b.

Second Preferred Embodiment

An acoustic wave device and a method for manufacturing the acoustic wave device according to a second preferred embodiment of the present invention will now be described with reference to FIGS. 9A to 11B.

As in the first preferred embodiment, the piezoelectric substrate 1 is prepared first, and the first electrode film 2 is arranged on the top surface of the piezoelectric substrate 1. In this preferred embodiment, as in the first preferred embodiment, the first electrode film 2 preferably defines the IDT electrodes 3 and the reflectors 4 and 5. The same elements as in the first preferred embodiment are assigned the same reference signs to omit a description thereof.

In this preferred embodiment, additionally, as in the first preferred embodiment, the first electrode film 2 is made of a layered metal film including a titanium film and an aluminum-copper alloy film deposited thereon. The titanium film preferably has a thickness of about 10 nm, and the aluminum-copper alloy film has a thickness of about 150 nm, for example. The aluminum-copper alloy film preferably has a copper concentration of about 1% by weight, for example.

Figure 9A:
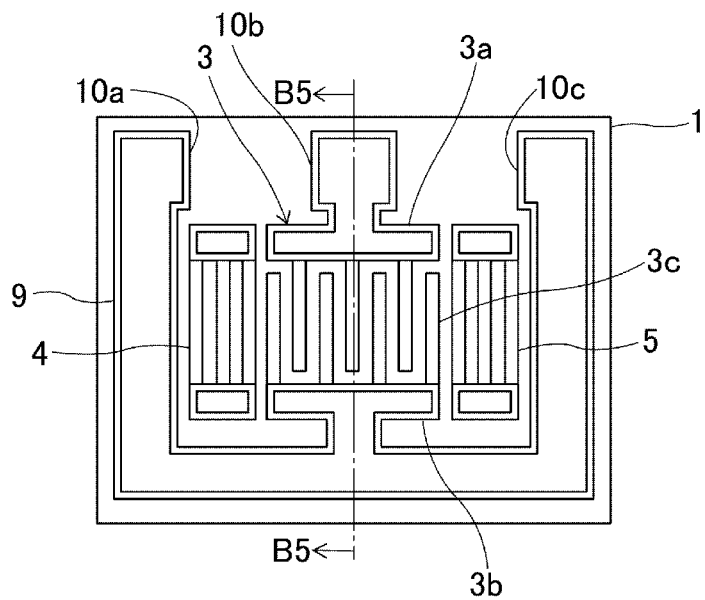
FIG. 9A is a schematic plan view showing the state after a second electrode film is arranged in a method for manufacturing an acoustic wave device according to a second preferred embodiment of the present invention.
Figure 9B:
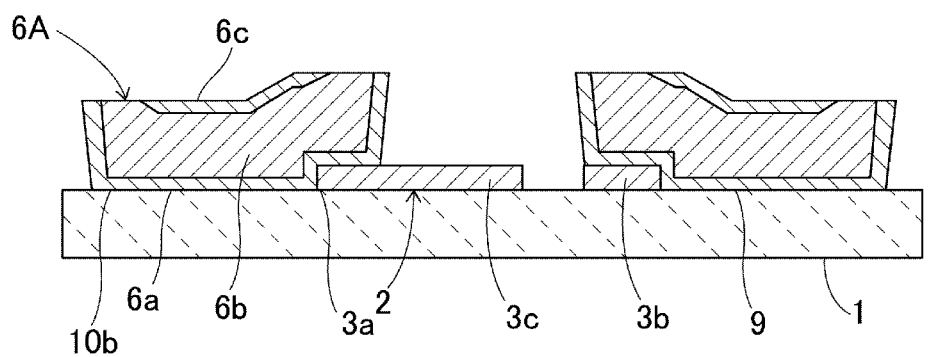
FIG. 9B is a schematic sectional view taken along line B5-B5 in FIG. 9A.

Referring to FIGS. 9A and 9B, a second electrode film 6A is provided. The second electrode film 6A is arranged to extend from the top surface of the piezoelectric substrate 1 to a portion of the top surface of the first electrode film 2. More specifically, the second electrode film 6A is arranged to extend from the top surface of the piezoelectric substrate 1 to the top surfaces of the bus bars 3a and 3b of the IDT electrodes 3 and the bus bars of the reflectors 4 and 5. In this preferred embodiment, the second electrode film 6A preferably defines the bus bars 3a and 3b of the IDT electrodes 3, the bus bars of the reflectors 4 and 5, the wiring electrode 9, and the pad electrodes 10a to 10c. Accordingly, in this preferred embodiment, the bus bars 3a and 3b of the IDT electrodes 3 and the bus bars of the reflectors 4 and 5 are made of the laminate of the first electrode film 2 and the second electrode film 6A. This improves the effect of confining surface acoustic waves in the IDT electrodes 3.

In addition, the electrode fingers 3c of the IDT electrodes 3 and the electrode fingers of the reflectors 4 and 5 are preferably only defined by the first electrode film 2. The wiring electrode 9 and the pad electrodes 10a to 10c are preferably only defined by the second electrode film 6A.

This preferred embodiment differs from the first preferred embodiment in that the second electrode film 6A is preferably made of a layered metal film including an aluminum-copper alloy film, a titanium film, an aluminum film, and a titanium film deposited in the above order. That is, the lowermost layer 6a of the second electrode film 6A is an aluminum-copper alloy film, and the uppermost layer 6c is a titanium film. As in the first preferred embodiment, the second electrode film 6A can be defined using a planetary rotating and orbiting evaporation system. Specifically, the second electrode film 6A is preferably formed by a lift-off process with evaporation using a planetary rotating and orbiting evaporation system. In this preferred embodiment, the aluminum-copper alloy film, the titanium film, the aluminum film, and the titanium film are continuously deposited in the above order using a planetary rotating and orbiting vacuum evaporation system. The lowermost layer 6a, namely, the aluminum-copper alloy film, preferably has a thickness of about 700 nm, the titanium film deposited on the top surface thereof preferably has a thickness of about 500 nm, the aluminum film preferably has a thickness of about 1,140 nm, and the uppermost layer 6c, namely, the titanium film, preferably has a thickness of about 100 nm, for example. In addition, the aluminum-copper alloy film preferably has a copper concentration of about 10% by weight, for example.

In this preferred embodiment, the lowermost layer 6a may preferably be a metal film made of one of aluminum-copper alloy, nickel-chromium alloy, aluminum-silicon alloy, aluminum-titanium alloy, titanium, and copper, for example.

In this preferred embodiment, the uppermost layer 6c is also preferably made of titanium. This more effectively inhibits migration in the second electrode film 6A, which defines the wiring electrode 9. As in the first preferred embodiment, the lowermost layer 6a and the portion of the upper layer 6b other than the uppermost layer 6c can be defined using an appropriate metal or alloy.

In this preferred embodiment, the second electrode film 6A preferably includes an aluminum film, which reduces the resistance of the wiring electrode 9. In addition, the second electrode film 6A is thicker than the first electrode film 2. This also preferably reduces the resistance of the wiring electrode 9.

Figure 10A:
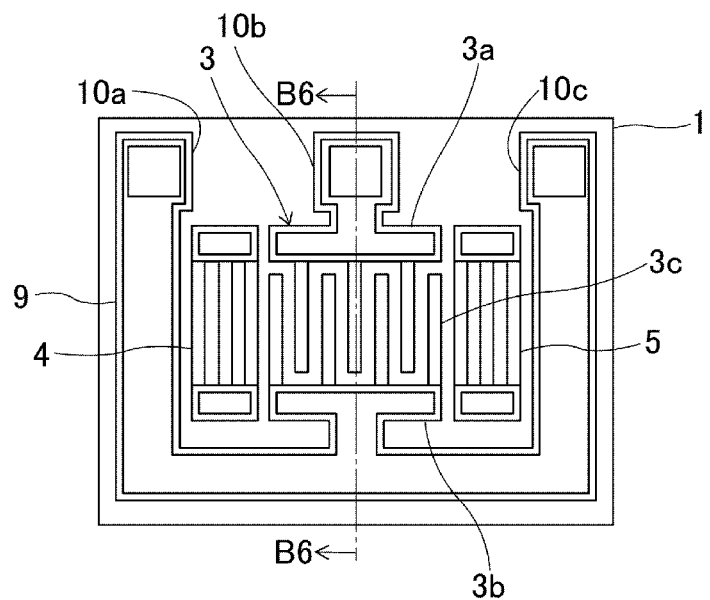
FIG. 10A is a schematic plan view showing the state after openings are arranged in the method for manufacturing the acoustic wave device according to the second preferred embodiment of the present invention.
Figure 10B:
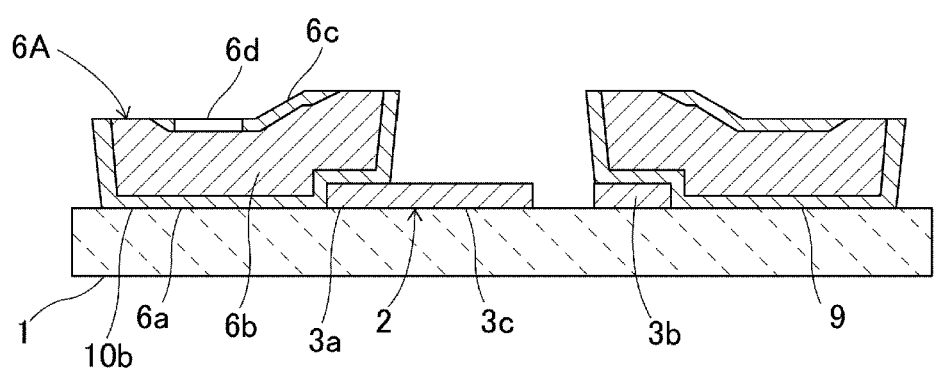
FIG. 10B is a schematic sectional view taken along line B6-B6 in FIG. 10A.

Turning to FIGS. 10A and 10B, in the pad electrodes 10a to 10c, the uppermost layer 6c of the second electrode film 6A, namely, the titanium film, is preferably etched to define openings 6d in the uppermost layer 6c, namely, the titanium film. The top surface of the upper layer 6b, specifically, the top surface of the aluminum film, is exposed in the openings 6d.

Figure 11A:
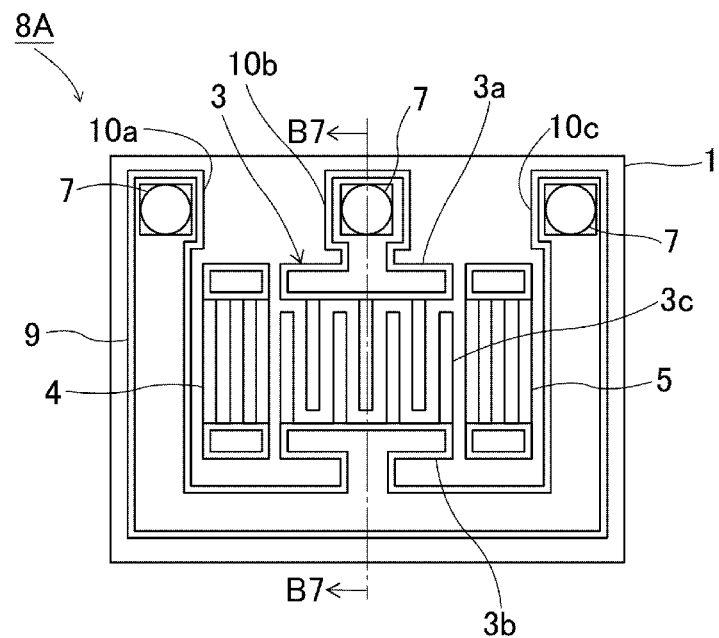
FIG. 11A is a schematic plan view of an acoustic wave device manufactured by the method for manufacturing the acoustic wave device according to the second preferred embodiment of the present invention.
Figure 11B:
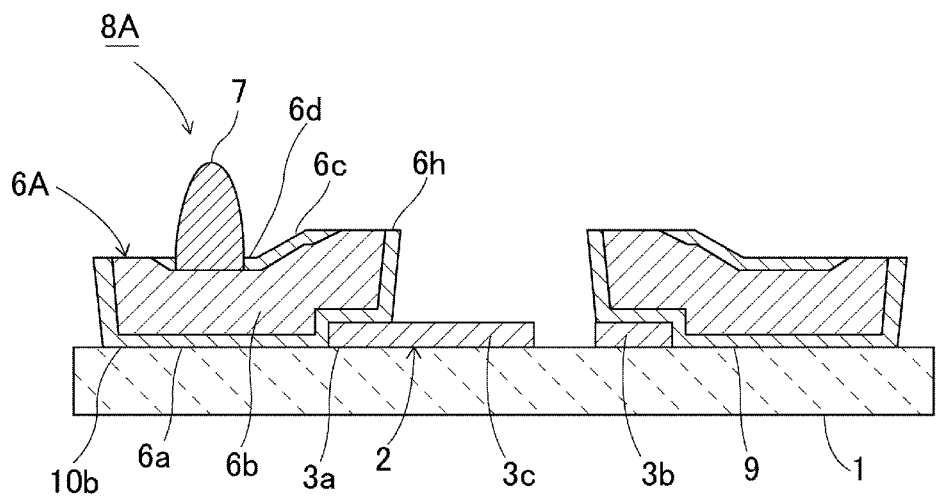
FIG. 11B is a schematic sectional view taken along line B7-B7 in FIG. 11A.

Turning to FIGS. 11A and 11B, gold bumps 7 are preferably arranged on the pad electrodes 10a to 10c. Specifically, the bumps 7 are arranged on the aluminum film exposed in the openings 6d. The bumps 7 may alternatively be made of another metal such as, for example, aluminum or solder.

In this preferred embodiment, in the pad electrodes 10a to 10c, the uppermost layer 6c of the second electrode film 6A, namely, the titanium film, is preferably etched to define the openings 6d in the uppermost layer 6c, namely, the titanium film. Accordingly, the gold bumps 7 contact the aluminum film. This results in increased adhesion strength between the pad electrodes 10a to 10c and the bumps 7.

In this way, an acoustic wave device 8A shown in FIGS. 11A and 11B can be manufactured. The acoustic wave device 8A is preferably a one-port surface acoustic wave resonator.

The acoustic wave device 8A of this preferred embodiment is characterized in that the lowermost layer 6a of the second electrode film 6A, which defines the wiring electrode 9, is preferably made of an aluminum-copper alloy film arranged to cover the side surfaces of the upper layer 6b, which is made of a titanium film and an aluminum film, and in that a titanium film is provided as the uppermost layer 6c. The aluminum-copper alloy film defining the lowermost layer 6a of the second electrode film 6A and the titanium film defining the uppermost layer 6c are resistant to migration. Specifically, migration preferably does not occur at a temperature of about 150° C. to about 200° C.

That is, in the second preferred embodiment, the aluminum-copper alloy film defining the lowermost layer 6a, which covers the side surfaces of the upper layer 6b of the second electrode film 6A, preferably inhibits migration in the side surfaces of the aluminum film in the upper layer 6b. In addition, the titanium film defining the uppermost layer 6c of the second electrode film 6A preferably inhibits migration in the top surface of the aluminum film in the upper layer 6b. Thus, migration can be effectively inhibited in the side and top surfaces of the aluminum film in the upper layer 6b of the second electrode film 6A.

In a surface acoustic wave device in which a piezoelectric substrate having electrodes provided thereon is bonded to, for example, a mounting board by flip chip bonding, migration in a wiring electrode or pad electrode causes a problem such as a short-circuit between the wiring electrode or pad electrode and a land electrode arranged on a die-attach surface of the mounting board. Such a problem can be reliably avoided in the acoustic wave device 8A of the present preferred embodiment.

While the uppermost layer 6c, which inhibits migration, is preferably made of a titanium film in this preferred embodiment, the uppermost layer 6c may be made of another metal that is more resistant to migration than the lowermost layer 6a and the metal films other than the uppermost layer 6c of the second electrode film 6A. Specifically, the uppermost layer 6c may be a metal film made of one of aluminum-copper alloy, nickel-chromium alloy, aluminum-silicon alloy, aluminum-titanium alloy, titanium, and copper. These metals can be used to reliably inhibit migration in the second electrode film 6A.

The uppermost layer 6c preferably has a thickness of about 100 nm or more, for example. In this case, migration can be more effectively inhibited in the aluminum film in the upper layer 6b.

Third Preferred Embodiment

An acoustic wave device and a method for manufacturing the acoustic wave device according to a third preferred embodiment of the present invention will now be described with reference to FIGS. 12A to 14B.

As in the first preferred embodiment, the piezoelectric substrate 1 is preferably prepared first, and the first electrode film 2 is arranged on the top surface of the piezoelectric substrate 1. In this preferred embodiment, as in the first preferred embodiment, the first electrode film 2 preferably defines the IDT electrodes 3 and the reflectors 4 and 5. The same elements as in the first preferred embodiment are assigned the same reference signs to omit a description thereof.

In this preferred embodiment, additionally, as in the first preferred embodiment, the first electrode film 2 is preferably made of a layered metal film including a titanium film and an aluminum-copper alloy film deposited thereon. The titanium film preferably has a thickness of about 10 nm, and the aluminum-copper alloy film has a thickness of about 150 nm, for example. The aluminum-copper alloy film preferably has a copper concentration of about 1% by weight, for example.

As in the first preferred embodiment, the second electrode film 6 is provided. The second electrode film 6 is arranged to extend from the top surface of the piezoelectric substrate 1 to a portion of the top surface of the first electrode film 2. More specifically, the second electrode film 6 is arranged to extend from the top surface of the piezoelectric substrate 1 to the tops of the bus bars 3a and 3b of the IDT electrodes 3 and the bus bars of the reflectors 4 and 5. The second electrode film 6 defines the bus bars 3a and 3b of the IDT electrodes 3, the bus bars of the reflectors 4 and 5, the wiring electrode 9, and the pad electrodes 10a to 10c. Accordingly, in this preferred embodiment, the bus bars 3a and 3b of the IDT electrodes 3 and the bus bars of the reflectors 4 and 5 are made of the laminate of the first electrode film 2 and the second electrode film 6. This improves the effect of confining surface acoustic waves in the IDT electrodes 3.

In addition, the electrode fingers 3c of the IDT electrodes 3 and the electrode fingers of the reflectors 4 and 5 preferably are composed only of the first electrode film 2. The wiring electrode 9 and the pad electrodes 10a to 10c preferably are composed only of the second electrode film 6.

The second electrode film 6 is made of a layered metal film including an aluminum-copper alloy film, a titanium film, and an aluminum film deposited in the above order. That is, as shown in FIG. 12B, the lowermost layer 6a of the second electrode film 6 is preferably made of an aluminum-copper alloy film. The aluminum-copper alloy film preferably has a thickness of about 700 nm, the titanium film preferably has a thickness of about 500 nm, and the aluminum film preferably has a thickness of about 1,140 nm, for example. In addition, the aluminum-copper alloy film preferably has a copper concentration of about 10% by weight, for example.

As in the first preferred embodiment, the second electrode film 6 can be defined using a planetary rotating and orbiting evaporation system. Specifically, the second electrode film 6 is preferably formed by a lift-off process with evaporation using a planetary rotating and orbiting vacuum evaporation system.

Figure 12A:
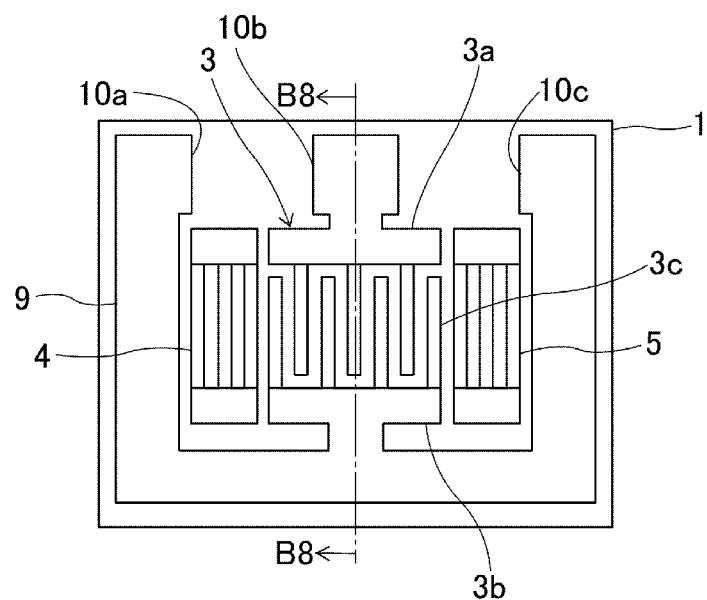
FIG. 12A is a schematic plan view showing the state after a third electrode film is arranged in a method for manufacturing an acoustic wave device according to a third preferred embodiment of the present invention.
Figure 12B:
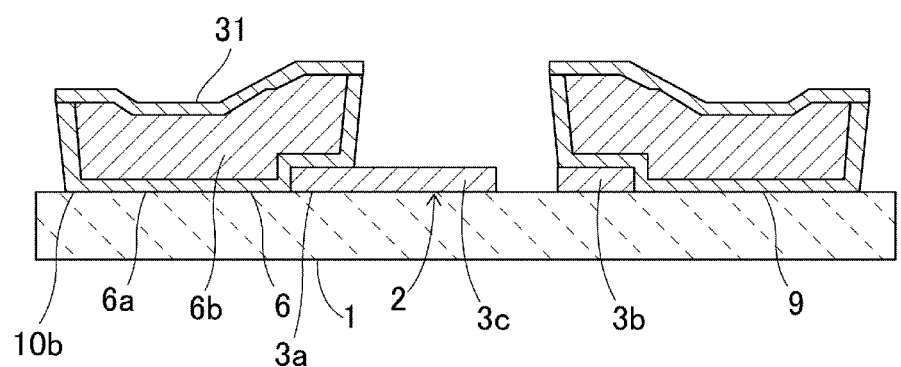
FIG. 12B is a schematic sectional view taken along line B8-B8 in FIG. 12A.

As shown in FIGS. 12A and 12B, a third electrode film 31 is preferably arranged on the second electrode film 6. The third electrode film 31 is preferably made of a titanium film. The third electrode film 31, however, may be made of another metal film if so desired.

In this preferred embodiment, the third electrode film 31 is preferably formed by a lift-off process with evaporation. The third electrode film 31, however, may be formed by, for example, sputtering, etching, etc.

Figure 13A:
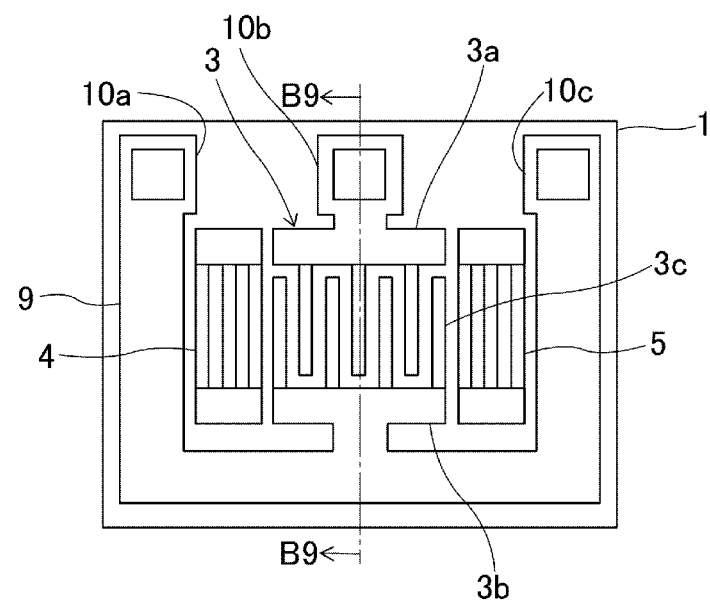
FIG. 13A is a schematic plan view showing the state after openings are arranged in the method for manufacturing the acoustic wave device according to the third preferred embodiment of the present invention.
Figure 13B:
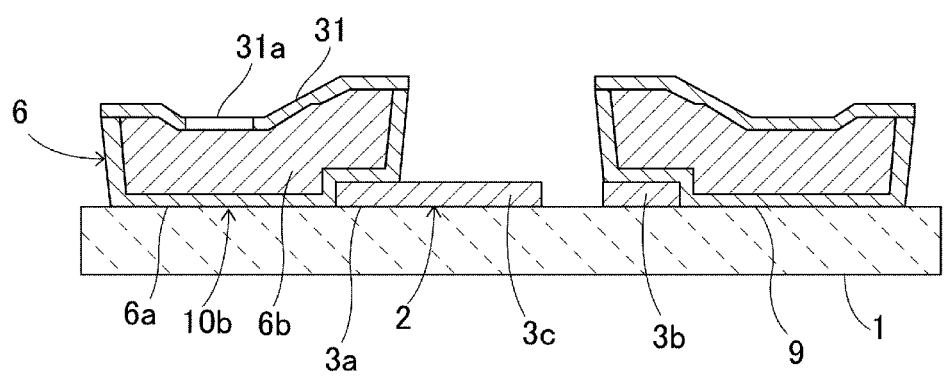
FIG. 13B is a schematic sectional view taken along line B9-B9 in FIG. 13A.

Turning to FIGS. 13A and 13B, in the pad electrodes 10a to 10c, the third electrode film 31, namely, the titanium film, is preferably etched to define openings 31a in the third electrode film 31. The top surface of the upper layer 6b of the second electrode film 6, specifically, the top surface of the aluminum film, is exposed by the openings 31a.

Figure 14A:
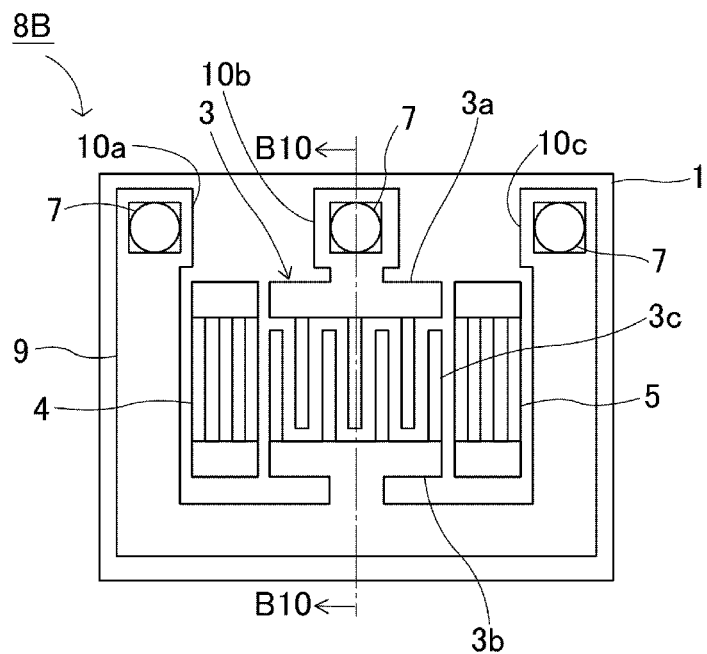
FIG. 14A is a schematic plan view of an acoustic wave device manufactured by the method for manufacturing the acoustic wave device according to the third preferred embodiment of the present invention.
Figure 14B:
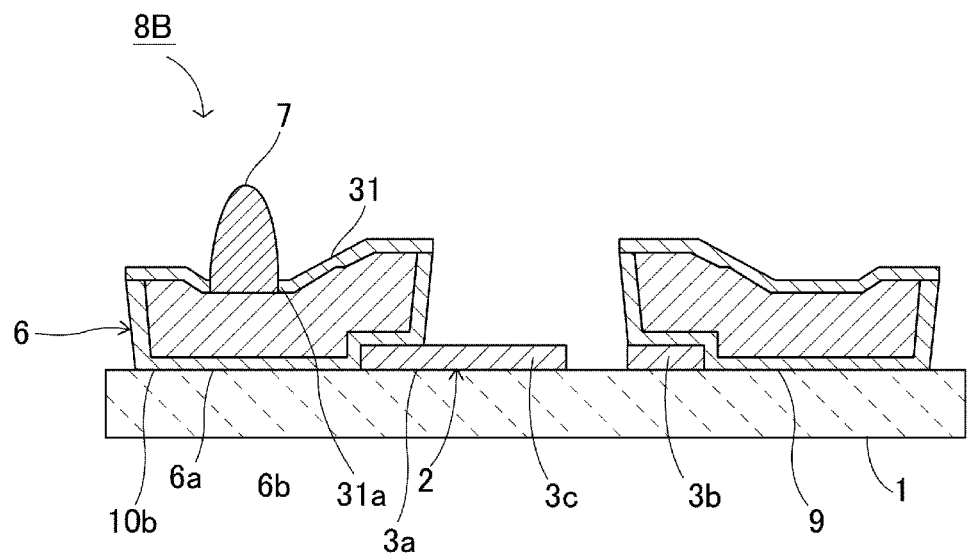
FIG. 14B is a schematic sectional view taken along line B10-B10 in FIG. 14A.

Turning to FIGS. 14A and 14B, gold bumps 7 are preferably arranged on the pad electrodes 10a to 10c. Specifically, the bumps 7 are arranged on the aluminum film, exposed in the openings 31a of the third electrode film 31, in the upper layer 6b of the second electrode film 6. The bumps 7 may also be made of another metal such as, for example, aluminum or solder.

In this preferred embodiment, in the pad electrodes 10a to 10c, the third electrode film 31, namely, the titanium film, is preferably etched to define the openings 31a. Accordingly, the gold bumps 7 contact the aluminum film in the upper layer 6b of the second electrode film 6. This results in increased adhesion strength between the pad electrodes 10a to 10c and the bumps 7.

In this way, an acoustic wave device 8B shown in FIGS. 14A and 14B can be manufactured. The acoustic wave device 8B is preferably a one-port surface acoustic wave resonator.

The acoustic wave device 8B of this preferred embodiment is characterized in that the lowermost layer 6a of the second electrode film 6, which defines the wiring electrode 9, is preferably made of an aluminum-copper alloy film arranged to cover the side surfaces of the upper layer 6b, which is preferably made of a titanium film and an aluminum film, and in that the third electrode film 31 is arranged on the second electrode film 6. The aluminum-copper alloy film defining the lowermost layer 6a of the second electrode film 6 and the titanium film defining the third electrode film 31 are resistant to migration. Specifically, migration preferably does not occur at a temperature of about 150° C. to about 200° C.

In the third preferred embodiment, the third electrode film 31 is preferably formed by a different deposition process from the second electrode film 6. The third electrode film 31 can therefore be arranged to completely cover the top surfaces of the aluminum film in the upper layer 6b of the second electrode film 6 and the aluminum-copper alloy film defining the lowermost layer 6a. Thus, the third electrode film 31 can more reliably inhibit migration in the top surface of the aluminum film in the upper layer 6b of the second electrode film 6.

That is, in the third preferred embodiment, the aluminum-copper alloy film defining the lowermost layer 6a, which covers the side surfaces of the upper layer 6b of the second electrode film 6, preferably inhibits migration in the side surfaces of the aluminum film in the upper layer 6b. In addition, the titanium film defining the third electrode film 31 preferably inhibits migration in the top surface of the aluminum film in the upper layer 6b. Thus, migration can be reliably inhibited in the side and top surfaces of the aluminum film in the upper layer 6b of the second electrode film 6.

While the third electrode film 31, which inhibits migration, is preferably made of a titanium film in this preferred embodiment, it may be made of another metal that is more resistant to migration than the metal films of the second electrode film 6 other than the lowermost layer 6a. Specifically, the third electrode film 31 may be a metal film made of, for example, one of aluminum-copper alloy, nickel-chromium alloy, aluminum-silicon alloy, aluminum-titanium alloy, titanium, and copper. These metals can be used to reliably inhibit migration in the second electrode film 6.

The third electrode film 31 preferably has a thickness of about 100 nm or more, for example. In this case, migration can be more effectively inhibited in the aluminum film in the upper layer 6b.

Fourth Preferred Embodiment

An acoustic wave device and a method for manufacturing the acoustic wave device according to a fourth preferred embodiment of the present invention will now be described with reference to FIGS. 15A to 17B.

As in the first preferred embodiment, the piezoelectric substrate 1 is preferably prepared first, and the first electrode film 2 is arranged on the top surface of the piezoelectric substrate 1. In this preferred embodiment, as in the first preferred embodiment, the first electrode film 2 preferably defines the IDT electrodes 3 and the reflectors 4 and 5. The same elements as in the first preferred embodiment are assigned the same reference signs to omit a description thereof.

In this preferred embodiment, additionally, as in the first preferred embodiment, the first electrode film 2 is preferably made of a layered metal film including a titanium film and an aluminum-copper alloy film deposited thereon. The titanium film preferably has a thickness of about 10 nm, and the aluminum-copper alloy film preferably has a thickness of about 150 nm, for example. The aluminum-copper alloy film preferably has a copper concentration of about 1% by weight, for example.

As in the first preferred embodiment, the second electrode film 6 is preferably provided. The second electrode film 6 is preferably arranged to extend from the top surface of the piezoelectric substrate 1 to a portion of the top surface of the first electrode film 2. More specifically, the second electrode film 6 is preferably arranged to extend from the top surface of the piezoelectric substrate 1 to the tops of the bus bars 3a and 3b of the IDT electrodes 3 and the bus bars of the reflectors 4 and 5. The second electrode film 6 preferably defines the bus bars 3a and 3b of the IDT electrodes 3, the bus bars of the reflectors 4 and 5, the wiring electrode 9, and the pad electrodes 10a to 10c. Accordingly, in this preferred embodiment, the bus bars 3a and 3b of the IDT electrodes 3 and the bus bars of the reflectors 4 and 5 are preferably made of the laminate of the first electrode film 2 and the second electrode film 6. This improves the effect of confining surface acoustic waves in the IDT electrodes 3.

In addition, the electrode fingers 3c of the IDT electrodes 3 and the electrode fingers of the reflectors 4 and 5 are preferably provided by only the first electrode film 2. The wiring electrode 9 and the pad electrodes 10a to 10c are preferably provided by only the second electrode film 6.

The second electrode film 6 is preferably made of a layered metal film including an aluminum-copper alloy film, a titanium film, and an aluminum film deposited in the above order. That is, as shown in FIG. 15B, the lowermost layer 6a of the second electrode film 6 is preferably made of an aluminum-copper alloy film. The aluminum-copper alloy film preferably has a thickness of about 700 nm, the titanium film preferably has a thickness of about 500 nm, and the aluminum film preferably has a thickness of about 1,140 nm, for example. In addition, the aluminum-copper alloy film preferably has a copper concentration of about 10% by weight, for example.

As in the first preferred embodiment, the second electrode film 6 can be defined using a planetary rotating and orbiting evaporation system. Specifically, the second electrode film 6 is preferably formed by a lift-off process with evaporation using a planetary rotating and orbiting vacuum evaporation system.

Figure 15A:
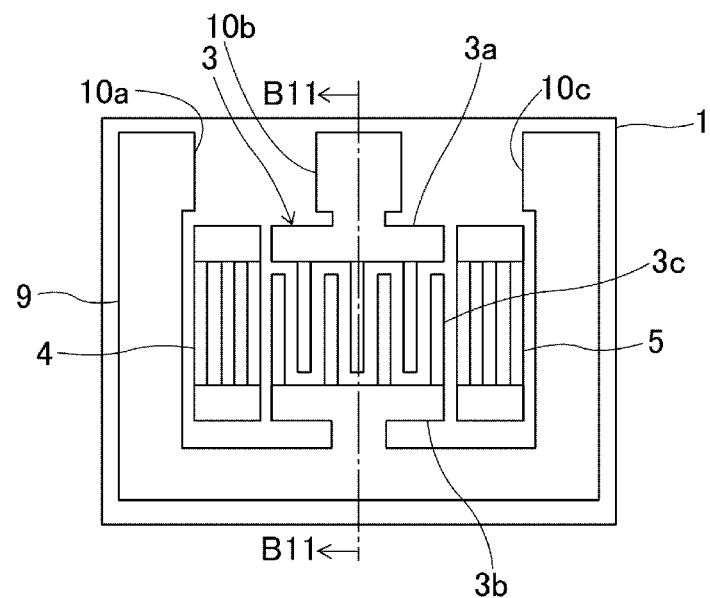
FIG. 15A is a schematic plan view showing the state after an insulating film is arranged in a method for manufacturing an acoustic wave device according to a fourth preferred embodiment of the present invention.
Figure 15B:
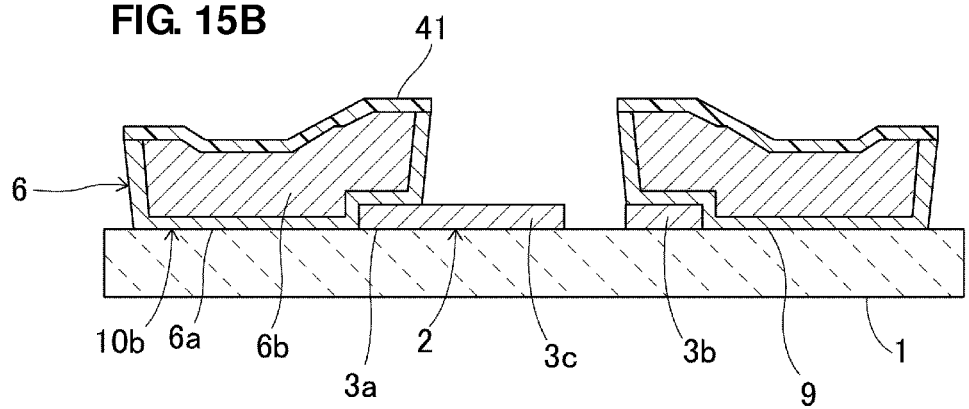
FIG. 15B is a schematic sectional view taken along line B11-B11 in FIG. 15A.

As shown in FIGS. 15A and 15B, an insulating film 41 is preferably arranged on the second electrode film 6. In this preferred embodiment, the insulating film 41 is preferably made of a SiO$_2$ film. In this preferred embodiment, the insulating film 41 is preferably formed by sputtering and dry etching. The insulating film 41, however, may be formed by any desirable process, such as evaporation, coating, wet etching, etc.

Figure 16A:
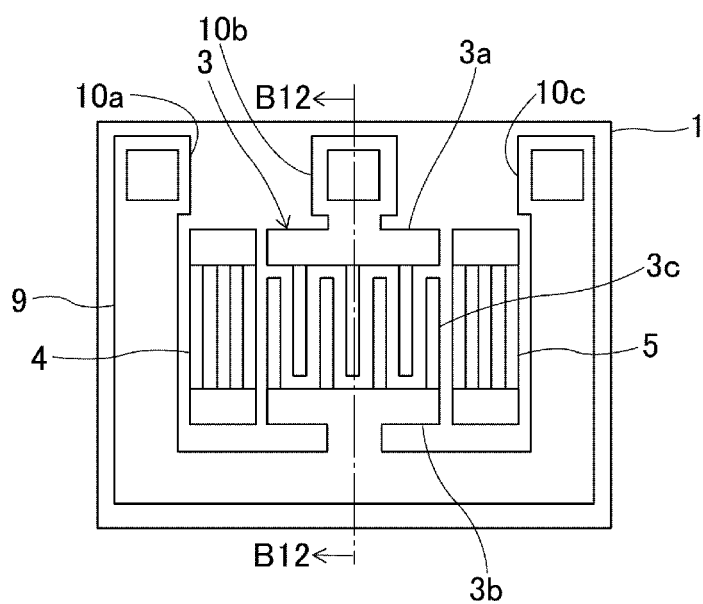
FIG. 16A is a schematic plan view showing the state after openings are arranged in the method for manufacturing the acoustic wave device according to the fourth preferred embodiment of the present invention.
Figure 16B:
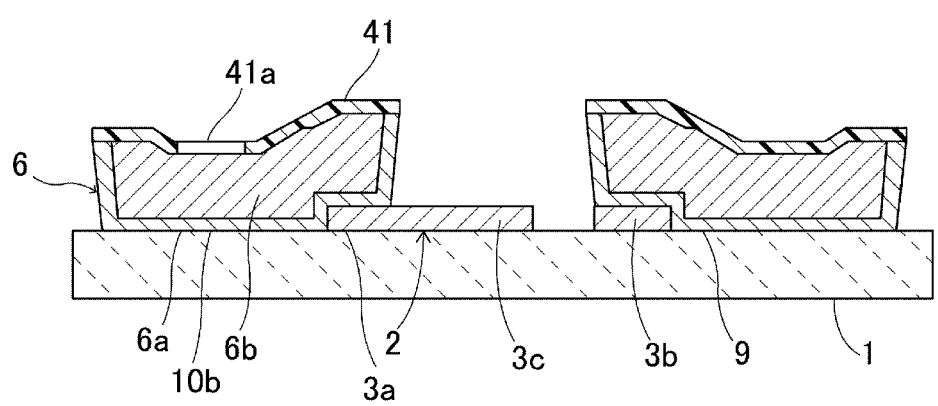
FIG. 16B is a schematic sectional view taken along line B12-B12 in FIG. 16A.

Turning to FIGS. 16A and 16B, in the pad electrodes 10a to 10c, the insulating film 41, namely, the SiO$_2$ film, is preferably etched to form openings 41a in the insulating film 41. The top surface of the upper layer 6b of the second electrode film 6, specifically, the top surface of the aluminum film, is exposed by the openings 41a.

Figure 17A:
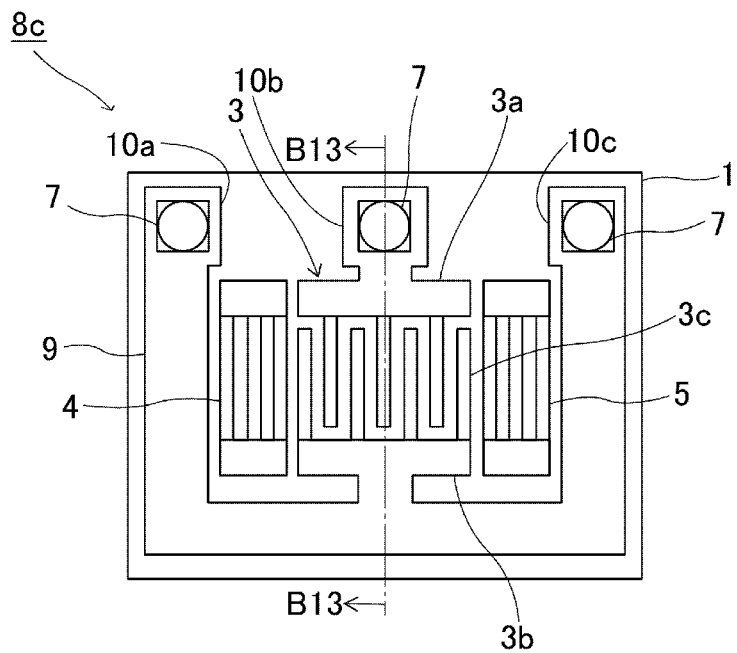
FIG. 17A is a schematic plan view of an acoustic wave device manufactured by the method for manufacturing the acoustic wave device according to the fourth preferred embodiment of the present invention.
Figure 17B:
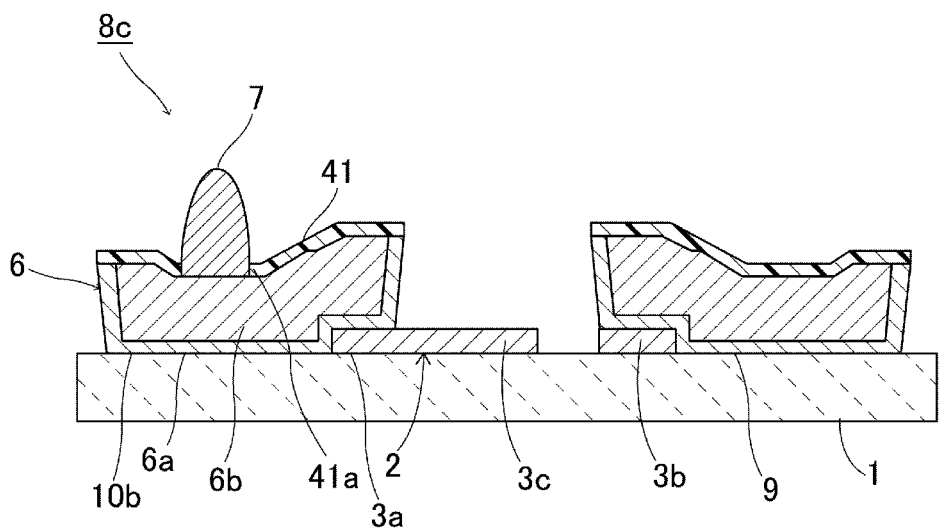
FIG. 17B is a schematic sectional view taken along line B13-B13 in FIG. 17A.

Turning to FIGS. 17A and 17B, gold bumps 7 are preferably arranged on the pad electrodes 10a to 10c. Specifically, the bumps 7 are arranged on the aluminum film, exposed in the openings 41a of the insulating film 41, in the upper layer 6b of the second electrode film 6. The bumps 7 may alternatively be made of another metal such as, for example, aluminum or solder.

In this preferred embodiment, in the pad electrodes 10a to 10c, the insulating film 41, namely, the SiO$_2$ film, is preferably etched to form the openings 41a. Accordingly, the gold bumps 7 contact the aluminum film in the upper layer 6b of the second electrode film 6. This results in increased adhesion strength between the pad electrodes 10a to 10c and the bumps 7.

In this way, an acoustic wave device 8c shown in FIGS. 17A and 17B can be manufactured. The acoustic wave device 8C is a one-port surface acoustic wave resonator.

The acoustic wave device 8c of this preferred embodiment is characterized in that the lowermost layer 6a of the second electrode film 6, which defines the wiring electrode 9, is preferably made of an aluminum-copper alloy film arranged to cover the side surfaces of the upper layer 6b, which is made of a titanium film and an aluminum film, and in that the insulating film 41 is arranged on the second electrode film 6. The aluminum-copper alloy film defining the lowermost layer 6a of the second electrode film 6 is resistant to migration. Specifically, migration preferably does not occur at a temperature of about 150° C. to about 200° C. In addition, migration preferably does not occur in the insulating film 41.

In the fourth preferred embodiment, the insulating film 41 can be arranged to completely cover the top surfaces of the aluminum film in the upper layer 6b of the second electrode film 6 and the aluminum-copper alloy film defining the lowermost layer 6a. Thus, the insulating film 41 can more reliably inhibit migration in the top surface of the aluminum film in the upper layer 6b of the second electrode film 6.

That is, in the fourth preferred embodiment, the aluminum-copper alloy film defining the lowermost layer 6a, which covers the side surfaces of the upper layer 6b of the second electrode film 6, inhibits migration in the side surfaces of the aluminum film in the upper layer 6b. In addition, the insulating film 41, namely, the SiO$_2$ film, inhibits migration in the top surface of the aluminum film in the upper layer 6b of the second electrode film 6. Thus, migration can be more reliably inhibited in the side and top surfaces of the aluminum film in the upper layer 6b of the second electrode film 6.

While the insulating film 41, which inhibits migration, is preferably made of a SiO$_2$ film in this preferred embodiment, it can be defined using various insulating materials. As such an insulating material, an inorganic insulating material or an organic insulating material can be used. If an inorganic insulating material is used, the insulating film 41 is resistant to degradation when exposed to relatively high temperatures. Examples of such materials for defining inorganic insulating films include, for example, AlN, Al$_2$O$_3$, Ta$_2$O$_5$, TeO$_2$, SiN, and SiON. On the other hand, if an organic insulating material is used, the insulating film 41 can be formed by a process with relatively low temperature. Examples of such materials for defining organic insulating films include, for example, organic resins such as polyimides, epoxy resins, phenolic resins, and amide resins. The insulating film 41 may also be a laminate of a film of an inorganic insulating material selected from the group consisting of SiO$_2$, AlN, Al$_2$O$_3$, Ta$_2$O$_5$, TeO$_2$, SiN, and SiON and a film of an organic insulating material selected from the group consisting of polyimides, epoxy resins, phenolic resins, and amide resins.

The insulating film 41 preferably has a thickness of about 100 nm or more, for example. In this case, migration can be more effectively inhibited in the aluminum film in the upper layer 6b.

In addition, the insulating film 41 is preferably arranged to cover the electrode fingers of the IDT electrodes 3. In this case, the frequency of the acoustic wave device can be adjusted by adjusting the thickness of the insulating film 41.

While one-port surface acoustic wave resonators including the IDT electrodes 3 and the reflectors 4 and 5 disposed on either side thereof have been described in the above preferred embodiments of the present invention, the acoustic wave device of the present invention is not limited thereto. The acoustic wave device of the present invention may also be a surface acoustic wave device such as, for example, a surface acoustic filter or a surface acoustic wave demultiplexer. In addition to surface acoustic wave devices, the present invention can be applied to boundary acoustic wave devices.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
  a piezoelectric substrate;
  a first electrode film arranged on a top surface of the piezoelectric substrate and defining electrodes including IDT electrodes; and
  a second electrode film arranged to extend from the top surface of the piezoelectric substrate to a portion of a top surface of the first electrode film; wherein
  the second electrode film defines electrodes including a wiring electrode and a pad electrode, and the second electrode film is defined by a layered metal film including a plurality of metal films deposited in layers;

a lowermost layer of the layered metal film defining the second electrode film includes a metal selected from the group consisting of aluminum-copper alloy, nickel-chromium alloy, aluminum-silicon alloy, aluminum-titanium alloy, titanium, and copper;

an upper layer of the layered metal film defining the second electrode film includes a top surface, a bottom surface, and side surfaces that extend between the top surface and the bottom surface; and the lowermost layer of the layered metal film defining the second electrode film is arranged to extend to and cover at least one of the side surfaces of the upper layer of the layered metal film defining the second electrode film.

2. The acoustic wave device according to claim 1, wherein the layered metal film defining the second electrode film includes a metal film including aluminum or gold.

3. The acoustic wave device according to claim 1, wherein an uppermost layer of the layered metal film defining the second electrode film includes a metal selected from the group consisting of aluminum-copper alloy, nickel-chromium alloy, aluminum-silicon alloy, aluminum-titanium alloy, titanium, and copper.

4. The acoustic wave device according to claim 1, further comprising a third electrode film arranged on the second electrode film.

5. The acoustic wave device according to claim 4, wherein the third electrode film includes a metal selected from the group consisting of aluminum-copper alloy, nickel-chromium alloy, aluminum-silicon alloy, aluminum-titanium alloy, titanium, and copper.

6. The acoustic wave device according to claim 1, further comprising an insulating film arranged on the second electrode film.

7. The acoustic wave device according to claim 6, wherein the insulating film includes a film including an inorganic insulating material selected from the group consisting of $SiO_2$, AlN, $Al_2O_3$, $Ta_2O_5$, $TeO_2$, SiN, and SiON.

8. The acoustic wave device according to claim 6, wherein the insulating film includes a film including an organic insulating material selected from the group consisting of polyimides, epoxy resins, phenolic resins, and amide resins.

9. The acoustic wave device according to claim 6, wherein the insulating film includes a film including an inorganic insulating material selected from the group consisting of $SiO_2$, AlN, $Al_2O_3$, $Ta_2O_5$, $TeO_2$, SiN, and SiON and a film including an organic insulating material selected from the group consisting of polyimides, epoxy resins, phenolic resins, and amide resins.

* * * * *